United States Patent
Fousset et al.

Patent Number: 5,729,182
Date of Patent: Mar. 17, 1998

[54] DEVICE FOR CONTINUOUS PHASE MODULATION BY FREQUENCY SYNTHESIZER WITH PHASE-LOCKED LOOP

[75] Inventors: Lionel Fousset, Athis-Mons; Marc Chelouche, Sannois; Jean-Luc De Gouy, Briis sous Forges; Laurent Collin, Paris, all of France

[73] Assignee: Thomson-CSF, Paris, France

[21] Appl. No.: 687,327
[22] PCT Filed: Feb. 2, 1995
[86] PCT No.: PCT/FR95/00129
§ 371 Date: Aug. 7, 1996
§ 102(e) Date: Aug. 7, 1996
[87] PCT Pub. No.: WO95/22196
PCT Pub. Date: Aug. 17, 1995

[30] Foreign Application Priority Data
Feb. 11, 1994 [FR] France .................. 94 01580
[51] Int. Cl.$^6$ .............. H03C 3/00; H03L 7/085; H03L 7/16; H03L 27/12
[52] U.S. Cl. .............. 332/100; 331/17; 331/23; 375/274; 375/278; 375/305
[58] Field of Search .............. 332/100–102, 332/144–148; 331/17, 23; 375/272, 274, 278, 296, 303–307

[56] References Cited

U.S. PATENT DOCUMENTS

| 5,144,260 | 9/1992 | Stribling et al. | 331/23 X |
| 5,150,082 | 9/1992 | Grimmett et al. | 331/23 X |
| 5,281,930 | 1/1994 | Taromaru et al. | 331/23 X |
| 5,412,353 | 5/1995 | Chaplik et al. | 331/23 X |
| 5,424,688 | 6/1995 | Phillips | 331/23 X |

*Primary Examiner*—David Mis
*Attorney, Agent, or Firm*—Oblon, Spivak, McClelland, Maier & Neustadt, P.C.

[57] ABSTRACT

Device for continuous phase modulation, produced from a frequency synthesizer including a variable oscillator and a phase-locked loop with, in series, a frequency division circuit, a phase comparator and a low-pass filter. In order to reduce modulation in the loop, the modulation is applied not only to the input of the synthesizer but also, in compensation, in the loop. In order to eliminate the modulation residue in the loop, a control signal for the oscillator is derived by a circuit which performs a correlation between the residue of the modulation and the output signal from a filter producing the same filtering effect as the loop, and which receives the modulation signal from the input of the synthesizer.

5 Claims, 4 Drawing Sheets

DEVICE FOR CONTINUOUS PHASE MODULATION BY FREQUENCY SYNTHESIZER WITH PHASE-LOCKED LOOP

BACKGROUND OF THE INVENTION

Continuous phase modulation by frequency synthesizer with phase-locked loop is known; the modulating signals are signals exhibiting continuous transitions in phase and may be of analogue or digital type according to circumstances. Among the digital signals used there are, among others, the signals known as MSK signals from their name in the literature, which is the acronym for Minimum Shift Keying, and which translates into French as minimum-displacement modulation or, better, as modulation with minimum phase gradient; a variant of the MSK signals which can also be used consists of signals known as GMSK signals, from their name in the literature: Gaussian Minimum Shift Keying.

A frequency synthesizer with a phase-locked loop essentially includes a controlled-frequency oscillator and a phase-locked loop. The oscillator, which will be called variable oscillator in the remainder of this document, is called voltage controlled oscillator or VCO in the literature. The slaving loop includes, successively between the output and the input of the variable oscillator, a frequency division circuit, a phase comparator and a low-pass filter; in the comparator, the synthesizer with phase-locked loop output signal of the frequency division circuit is compared with the signal supplied by a reference oscillator. In order to perform continuous phase modulation of the output signal of the variable oscillator, it is known to apply the modulation signal either by addition to the signal supplied by the filter to the variable oscillator, or by subtraction from the signal supplied by the phase comparator to the low-pass filter, or as a control of the rate of division of the division circuit; these three ways of working exhibit various drawbacks which will be seen further on and, among these drawbacks, one common drawback: the modulation frequency band is affected by the frequency band of the loop.

It is known to reduce these drawbacks by applying the modulation signal not only by addition to the signal supplied by the filter to the oscillator but also, in order to compensate for the effects of the modulation in the loop, by applying it either by subtraction from the signal supplied by the phase comparator to the low-pass filter, or as a control of the rate of division of the division circuit. Despite everything, there still remains a modulation residue in the control signal derived by the loop, in particular due to the drift, in temperature and over time, of the components.

SUMMARY OF THE INVENTION

The object of the present invention is to reduce, or even to cancel out, this residue.

This is obtained, in particular, by deriving a correction signal in a continuous way and thus differently from what is proposed in the patent application UK 2,228,840, where the operation of a synthesizer is stopped in order to be able to apply a specific test signal to it, in place of the modulation signal, and to adjust the loop; it results therefrom not only that the operation of the synthesizer has to be interrupted but that, after the adjustment, the synthesizer loses its setting depending on the drift of its components.

According to the invention, there is provided a modulation device for continuous phase modulation by frequency synthesizer, including an adder circuit with a modulation input, a control input and an output, a variable oscillator with a control input coupled to the output of the adder circuit to receive a control voltage, and an output, a slaving loop with an input coupled to the output of the oscillator and an output coupled to the control input of the adder circuit, the slaving loop including a reference oscillator and, successively between the output and the input of the loop, a frequency division circuit, a phase comparator and a loop filter of low-pass type, having an output, the comparator comparing the output signals of the division circuit and of the reference oscillator, and the loop including one of two modulation accesses which consist respectively of an input coupled to the input of the loop filter and of a control input for the control of the division circuit, said device further including means for continuous correction of the modulation residues in the loop, these means including a compensation filter with an input coupled to the modulation input, these compensation filter producing the same filtering effect as the loop, and a correlation circuit with two inputs coupled respectively to the compensation filter and to the loop filter and an output coupled to the control input of the variable in order to supply a correction signals.

BRIEF DESCRIPTION OF THE DRAWINGS

The present invention will be better understood and other characteristics will emerge with the aid of the description below and of the figures relating thereto which represent.

In the various figures the corresponding elements are designated by the same references.

DETAILED DESCRIPTION

Figure 1:
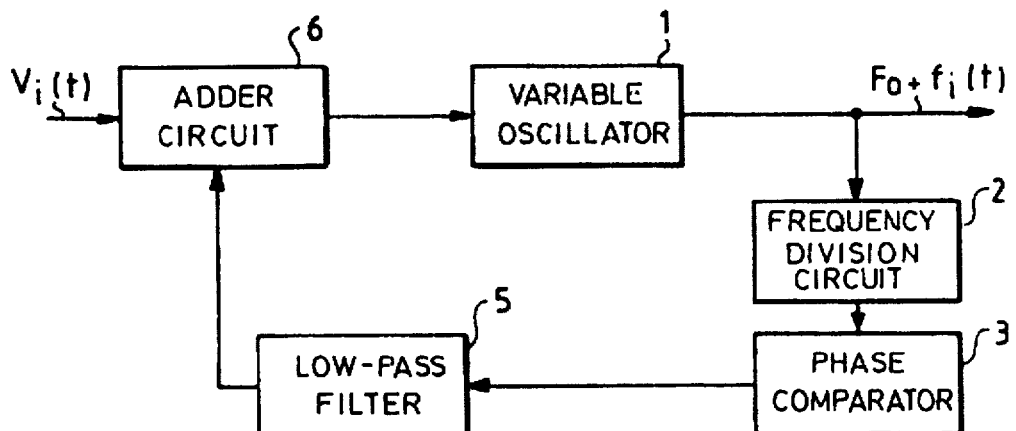
FIGS. 1 to 3, modulation devices according to the prior art

FIG. 1 represents a modulation device according to the prior art, produced from a frequency synthesizer with phase-locked loop, that is to say a synthesizer including a variable oscillator 1 and a loop for slaving the variable oscillator in phase. The loop includes a phase-accumulator frequency division circuit 2, a phase comparator 3, a reference oscillator 4 which supplies a signal of fixed frequency Fr and a low-pass filter 5. The variable oscillator 1 delivers a signal at the frequency $$\left(N + \frac{K}{M}\right) Fr$$

where N is an integer and K/M a fraction K less than 1, with K and M integers greater respectively than −1 and 1; this signal constitutes the output signal of the synthesizer and the input signal of the frequency division circuit 2. The phase comparator 3 compares the signals delivered by the division circuit 2 and by the reference oscillator 4 and supplies a signal which, after filtering in the low-pass filter 5, constitutes a signal for voltage control of the frequency of the variable oscillator 1.

The variable oscillator 1 is voltage-controlled by a voltage which is a function of the frequency Fo to be obtained and thus of N+K/M. The phase-accumulator frequency division circuit 2 includes a variable-rate frequency divider which is preset to divide by N and a phase accumulator modulo M which couples the output of the divider to a control input of this same divider. The divider has a signal input and output which constitute the signal input and output of the frequency division circuit 2. The phase accumulator includes a control input to which the value K is applied, so that the phase accumulator delivers to the divider K pulses for M periods of the output signal of the divider. According to whether the divider does or does not receive a pulse on its control input, its division ratio passes to the value N+1 or remains at the value N. Hence, when the synthesizer, used purely as a synthesizer, and thus without modulation signal, is synchronized, that is to say when the output signal of the divider is at the frequency Fr of the output signal of the reference oscillator 4, the frequency of the input signal of the divider is equal to $$\left(N + \frac{K}{M}\right) Fr.$$

The slaving carried out by the phase loop produces, at the output of the filter 5, a voltage for control of the variable oscillator 1 which causes this oscillator to deliver a signal of frequency $$Fo = \left(N + \frac{K}{M}\right) Fr.$$

It should be noted that the slaving can be simplified and the performance enhanced by presetting the control of the variable oscillator to approximately the frequency Fo, with the aid of a DC voltage added to the control voltage delivered by the slaving loop.

The frequency synthesizer formed by the elements 1 to 5 is used as a modulation device by virtue of an adder circuit 6 which makes it possible to control the frequency of the oscillator 1 by a signal which is the sum of the loop signal supplied by the filter 5 and of a modulation signal $V_i(t)$ representing information to be transmitted. In the absence of the signal $V_i(t)$ the device according to FIG. 1 delivers the signal at the frequency Fo which was dealt with above and, when the signal $V_i(t)$ is present, it delivers a signal at the frequency Fo+$f_i(t)$ where $f_i(t)$ represents the modulation generated by $V_i(t)$ about the central frequency Fo.

It should be noted that FIG. 1, and likewise the other figures of this document, is a simplified diagram on which only the elements necessary to the understanding of the explanations given in the present text have been represented. Hence the presetting voltage, a function of N+K/M which is applied to the oscillator 1, has not been represented, and likewise neither have the digital signals been represented, with values N and K respectively, applied to the frequency divider and to the phase accumulator of the division circuit 2.

The modulation device according to FIG. 1 exhibits certain drawbacks:

the component $f_i(t)$ of the modulated frequency Fo+$f_i(t)$ corresponds to the modulation signal $V_i(t)$ but filtered by a high-pass filter, the cutoff frequency of which is determined by the loop frequency band since, for the phase-locked loop, $V_i(t)$ is perceived as an interfering signal to be eliminated, the component $f_i(t)$ is a contributor to the variations in the curve of output frequency/control voltage of the variable oscillator 1.

Figure 2:
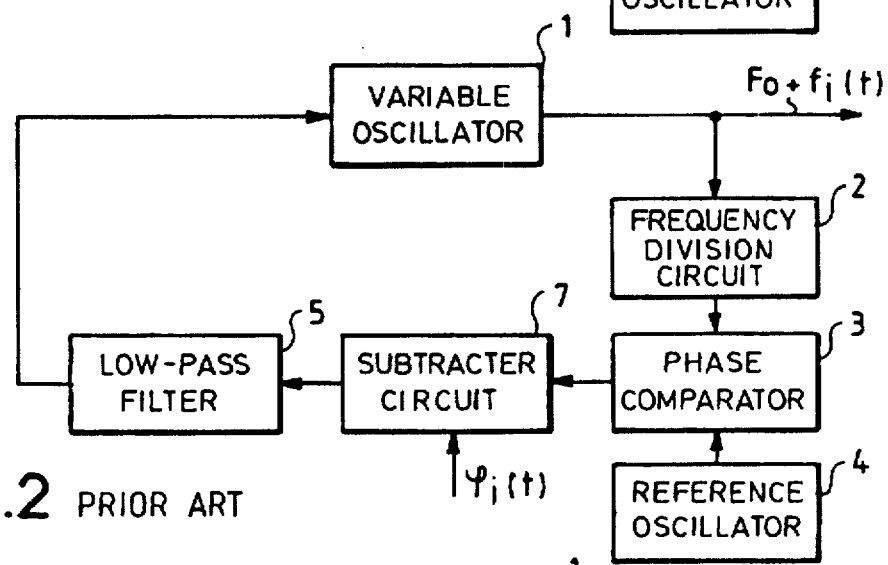

FIG. 2 represents a second modulation device according to the prior art, also produced from a frequency synthesizer with phase-locked loop. This modulation device is distinguished from that according to FIG. 1 by the deletion of the adder circuit 6, replaced by a direct link between the low-pass filter 5 and the variable oscillator 1; it is also distinguished by the interposition of a subtracter circuit 7 between the phase comparator 3 and the low-pass filter 5, with a first input linked to the output of the phase comparator, a second input and an output linked to the input of the low-pass filter 5. It is to the second input of the subtracter circuit that a modulation signal $\phi_i(t)$ is applied, representing information to be transmitted and which, in this case, no longer behaves as a control voltage for the variable oscillator 1, but as a phase offset between the modulated signal Fo+$f_i(t)$ after division and the signal from the reference oscillator 4.

This type of modulation circuit exhibits two main drawbacks:

there is filtering of the modulation signal by a filter of width equivalent to the loop frequency band, $f_i(t)$ can be likened to the derivative of $\phi_i(t)$, however the modulation index, that is to say the peak-to-peak excursion in radians of the frequency- or phase modulation, is limited to N.2π where N is the division factor of the frequency division circuit 2; in effect, beyond N.2π the limits of the phase comparator are crossed.

Figure 3:
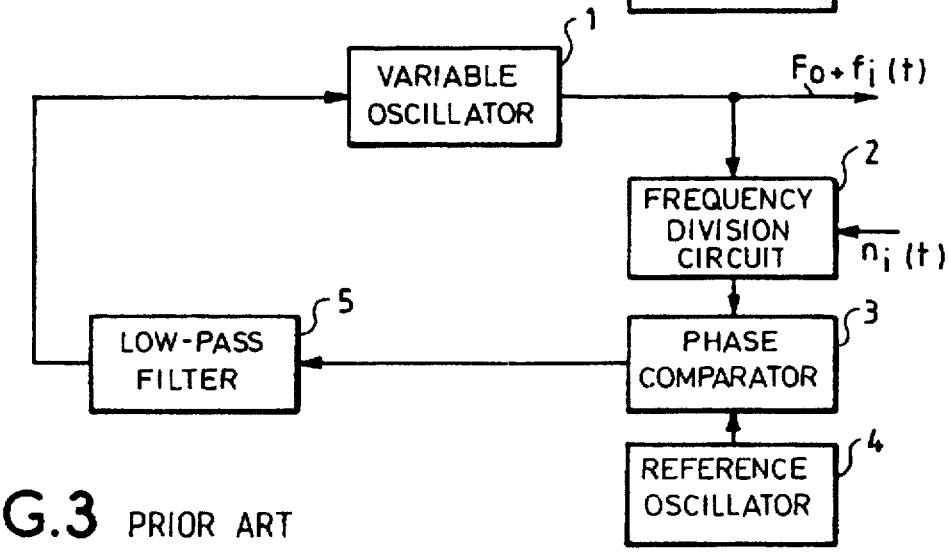

FIG. 3 relates to a third modulation device according to the invention, produced from the same frequency synthesizer as the modulation devices according to FIGS. 1 and 2. In this third device, the modulation signal is applied to the control input of the frequency division circuit 2 in the form of a division-rate control signal, $n_i(t)$, representing the information to be transmitted; the signal $n_i(t)$ is formed by pulses which, in the frequency division circuit, supplement the pulses supplied by the phase adder to the frequency divider, as was seen above. With respect to the diagram according to FIG. 1, the addition circuit 6 is dispensed with and the output of the filter 5 is linked directly to the control input of the variable oscillator 1.

The modulation device according to FIG. 3 itself also exhibits the drawback of having a modulation band limited to the loop band.

The frequency Fo+$f_i(t)$ of the output signal from the modulation circuit according to FIG. 3 is given by $n_i(t) \times Fr$, and $n_i(t)$ thus achieves modulation control quantised into levels with pitch 2π and quantised in time with pitch 1/Fr. This quantisation introduces quantisation noise into the output signal of the modulation circuit. In this modulation device, it should be noted that the loop frequency band is markedly less than Fr, in a ratio equal to at least 10, and that, for this reason, the control exercised by $n_i(t)$ constitutes an over-sampled control with regard to the first Shannon theorem; it is therefore possible to apply an algorithm to the signal $n_i(t)$, such as the sigma-delta algorithm or the multiple fractional-pitch algorithm, which makes it possible to reduce the quantisation noise without, however, causing it to disappear completely.

The modulations described with the aid of FIGS. 1, 2 and 3 will be called type 1, 2 and 3 modulations respectively in what follows, so as to simplify the naming thereof.

The rest of the description relates to modulation circuits which combine type 1 modulation with type 2 or 3 modulation, so as to be able practically to eliminate the phase modulation from the "frequency division circuit/phase comparator" chain, leaving only a modulation residue behind; it is thus possible, in particular, to avoid the frequency band of the modulation signal being limited by the loop frequency band. In the case of a combination of type 1 and 2 modulations, there remains a limitation on the modulation index determined by a peak phase excursion limited to N.2π where N is the division ratio of the division circuit 2. In the case of a combination of type 1 and 3 modulations, there is no longer a limitation on the modulation index but, as in type 3 modulation, quantisation noise remains. The combination of the three types of modulation, when it is perfectly implemented, will avoid the limitation on modulation index and the quantisation noise, at the cost, however, of slightly more complicated implementations.

Figure 4:
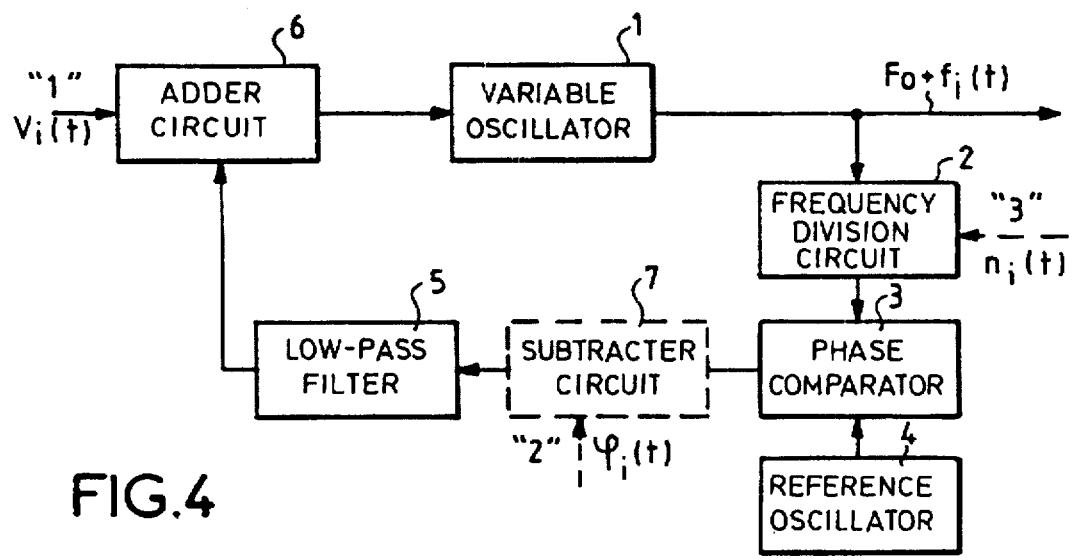
FIG. 4, a general diagram serving as an introduction to the presentation of the invention, FIGS. 5 to 9, diagrams of electronic layouts, which supplement the diagram according to FIG. 4.

FIG. 4 replicates elements 1 to 7 of FIGS. 1, 2 and 3 in order to show how the three types of modulation can be combined:

type 1 modulation by signal $V_i(t)$ applied to the adder circuit 6, type 2 modulation by signal $\phi_i(t)$ applied to the subtracter circuit 7, type 3 modulation by signal $n_i(t)$ applied to the frequency division circuit 2.

In FIG. 4, the means of introducing type 2 and 3 modulations, namely the subtracter circuit 7 and the link for bringing in the signal $\phi_i(t)$ on to the subtracter circuit 7, on the one hand, and the link for bringing in the signal $n_i(t)$ on to the frequency division circuit 2 on the other hand, have been represented by broken lines in order to indicate thereby that one or other of the type 2 and 3 modulations may be present but that they can equally well be present simultaneously; in the case in which type 2 modulation is absent, the output of the phase comparator 3 is linked directly to the input of the low-pass filter 5; in the case in which type 3 modulation is absent the link which terminates on the control input of the frequency division circuit 2 is dispensed with and control of the rate of division of the frequency divider by N or N+1 is done in the usual way, that is to say solely by way of the phase accumulator which the frequency division circuit includes.

Figure 5:
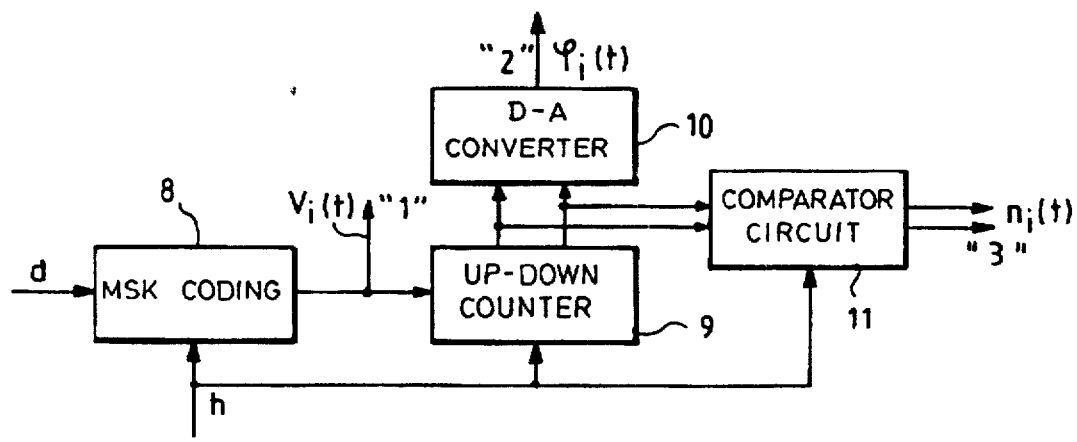

FIG. 5 shows how the signals $V_i(t)$, $\phi_i(t)$ and $n_i(t)$, which are necessary for the operation of the device according to FIG. 4, can be obtained; this figure relates to modulation by MSK or GMSK signals. Data, d, to be transmitted are coded, in a conventional way, in an MSK coding circuit, 8, at the rate of a clock signal, h, so as to supply the signal $V_i(t)$ used in the type 1 modulation. An up-down counter 9 counts at the rate of the signal h, and its count increases by one unit upon each high frequency of the MSK signal and reduces by one unit upon each low frequency of the MSK signal. Since the MSK modulation is formed by continuous phase transitions, of value $+\pi/2$ or $-\pi/2$ according to whether the new frequency brought about by the transition is a high frequency or a low frequency, two low-significance bits of the up-down counter 9 may suffice to supply, with the aid of a digital-analogue converter, 10, a type 2 modulation signal $\phi_i(t)$ which provides phase modulation over $2\pi$ radians. This two-bit switch is sufficient in the case in which the spectrum of the signal $\phi_i(t)$, in its part around the frequency h, is eliminated by the filter 5. If this is not the case, a first solution consists in transposing these undesirable spectral components to a frequency $2^n$ times higher, with n a sufficiently high integer; to do that, it is necessary to make the counter 9 work at a frequency $2^n$ times higher and repeat its input samples $2^n$ times; the converter 10 becomes an n+2-bit converter. A second solution consists in inserting a low-pass analogue filter at the output of the converter 10 and in delaying the control $V_i(t)$ intended for the circuit 6, by a value equal to the delay due to this low-pass filter. The overflows, above or below, from this field of $2\pi$ radians, are taken into account by a comparator circuit 11 which, at the rate of the clock signal h, compares the successive values taken by the two least-significant bits of the up-down counter 9; the comparator circuit 11 delivers a pulse on a first output upon the count of the up-down counter 9 passing from the value 11 to the value 00, this passage being characteristic of a positive overflow, and a pulse on a second output upon passing from the value 00 to the value 11; these two pulses constitute the signal $n_i(t)$ used in type 3 modulation and cause the rate of division of the division circuit 2 of FIG. 4 to pass respectively to the value N+1 and to the value N−1.

Figure 6:
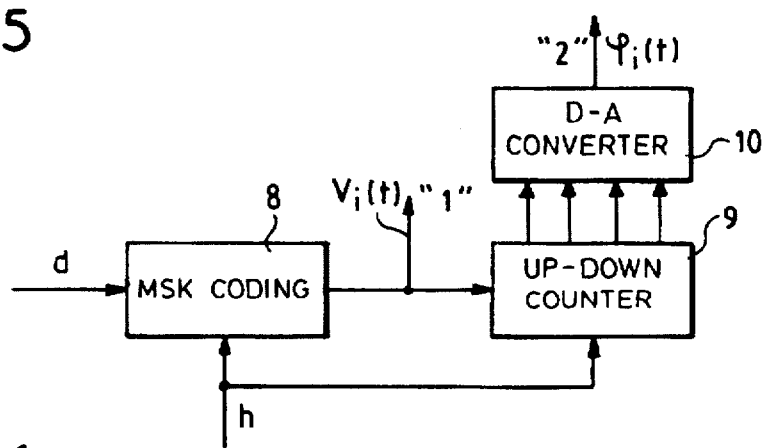

The signal $n_i(t)$ according to FIG. 5 can be used alone, that is to say without the signal $\phi_i(t)$ also being used, but the contrary is not true unless $\phi_i(t)$ is limited to a phase variation of $2\pi$ radians. In the case in which the range of the peak-to-peak phase excursion is less than $N.2\pi$ radians, it is possible, however, by modifying the layout according to FIG. 5, to perform type 2 modulation without type 3 modulation; to do that, it is necessary for the digital-analogue converter 10 to be able to convert into analogue any phase excursion in the range in question, that is to say that, if this range lies between $\pm k\pi$, where k is a positive integer, it is necessary for the digital-analogue converter 10 to be able to convert digital values formed by a number of bits equal to 2+log k or equal to the integer immediately above $2+\log_2 k$ if $\log_2 k$ is not an integer. FIG. 6 illustrates this variant for k=4; this figure is distinguished from FIG. 5 by the deletion of the comparator circuit 11 and by a converter 10 with four inputs instead of 2.

Figure 7:
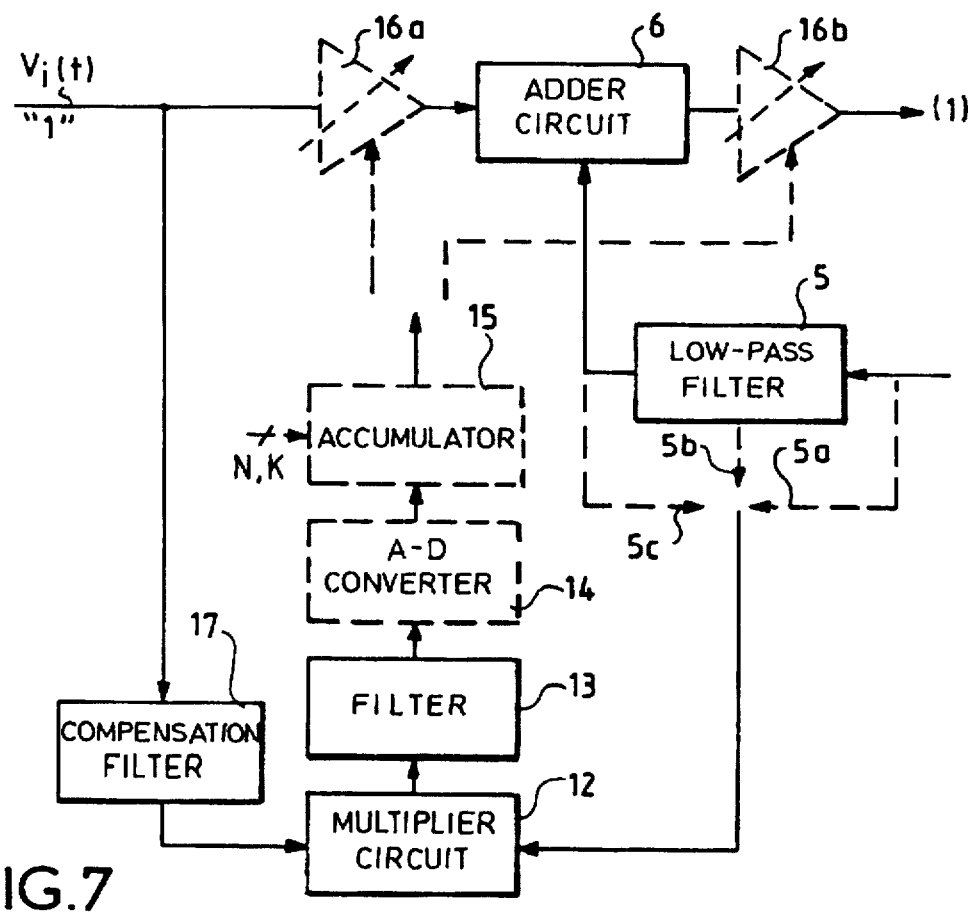

It should be noted that, if the characteristic of the frequency of the variable oscillator 1 with respect to its control voltage varies, as a function, for example, of temperature or of ageing, a signal residue correlated with the modulation persists in the filter 5 of FIG. 4, and the modulation is not at the anticipated value. FIG. 7 shows how to correct this defect by using the modulation residue to adjust the transfer function of the link between the input of the modulation device and the output of the variable oscillator 1; in the example described with the aid of FIG. 7, this is obtained not by controlling the gain of the variable oscillator 1 but, which is easier to achieve, by controlling the gain of a variable amplifier, 16a or 16b, placed either in the input circuit or in the output circuit of the adder circuit 6 of FIG. 4; in order to denote this freedom of choice, the amplifiers 16a, 16b have been drawn in broken lines, it being understood that only one of the two is employed, the other being replaced by a short-circuit. Likewise, as the modulation residue may, as chosen, be extracted from the input or output signal of the loop filter 5, or even from a signal taken from the loop filter, these three possibilities have been shown symbolically by three links in broken lines, 5a, 5b, 5c; only one of these three possibilities will be employed in a layout.

In order to obtain a value representative of the modulation residue, the signal taken from within the loop filter 5 is applied to the first input of a multiplier circuit 12, the second input of which is coupled by a compensation filter 17 to the type 1 modulation input of the modulation device, that is to say to the modulation input which receives the signal $V_i(t)$. The filter 17 is constructed so as to produce the same filtering effect as the loop on a modulation compensation error. The combination of the multiplier circuit 12 and of the filter 13 in fact forms the correlation between the two input signals of the multiplier circuit 12, which allows extraction of a signal proportional to the error due to the modifications of the characteristics of the variable oscillator 1.

The output signal of the multiplier circuit 12, after filtering in a bandpass filter 13, supplies the signal proportional to the variable oscillator 1 gain error, in order to control the gain of the amplifier 16a or 16b.

The layout which has just been described, in order to correct the variable oscillator 1 gain errors may be completed, between the output of the filter 13 and the control input of the variable amplifier, 16a or 16b, by an analogue-digital converter 14, followed by an accumulator 15 combined with a memory; by using an analogue-digital converter 14 which supplies only the sign bit, the accumulator 15 is reduced to an up-down counter. The accumulator supplies the control signal for the variable amplifier 16a or 16b. As for the memory of the accumulator 15, it makes it possible, for example in the case in which the modulation device is made to operate cyclically with different central frequencies Fo, to keep the value of the up-down counter from one use of each frequency Fo to the next one, and thus to be able to start modulation at a given frequency Fo with presetting of the correction for the modulation residue; to do this, the memory of the accumulator 15 includes as many addresses, where values of the up-down counter are stored, as there are different frequencies Fo, and addressing is performed by the numerical values N, K of the central frequencies Fo to be obtained. As the circuits 14 and 15 are not always employed in modulation residue correction, they have been drawn in broken lines in FIG. 7 and, in the event that they are not used, it suffices to alter FIG. 7 by replacing them by a direct link between the output of the filter 13 and the control input of the variable amplifier 16a or 16b.

It should be noted that the signal at the output of the compensation filter 17 of FIG. 7 gives the shape of the error, that is to say of the modulation residue. In order to simplify the multiplier circuit 12, it is thus possible to make do with two levels
−1 negative values
+1 positive values
or three levels
−1 negative values
0 zero value
+1 positive values
for the output signal of the compensation filter, meanwhile preserving information proportional to the variable oscillator gain error.

In the layout according to FIG. 7, the case in which the extraction of the modulation residue is carried out from the signal picked up from the output of the low-pass filter 5 exhibits the advantage of using a signal which is fairly limited in terms of bandwidth. This signal includes a DC component intended to set the variable oscillator to the frequency Fo; the insertion of means for presetting the control voltage of the oscillator 1 between the filter 5 and the adder circuit 6 makes it possible simultaneously to minimise the DC component of the output signal of the filter 5 and to reduce the time for switching the variable oscillator 1 in terms of frequency.

Figure 8:
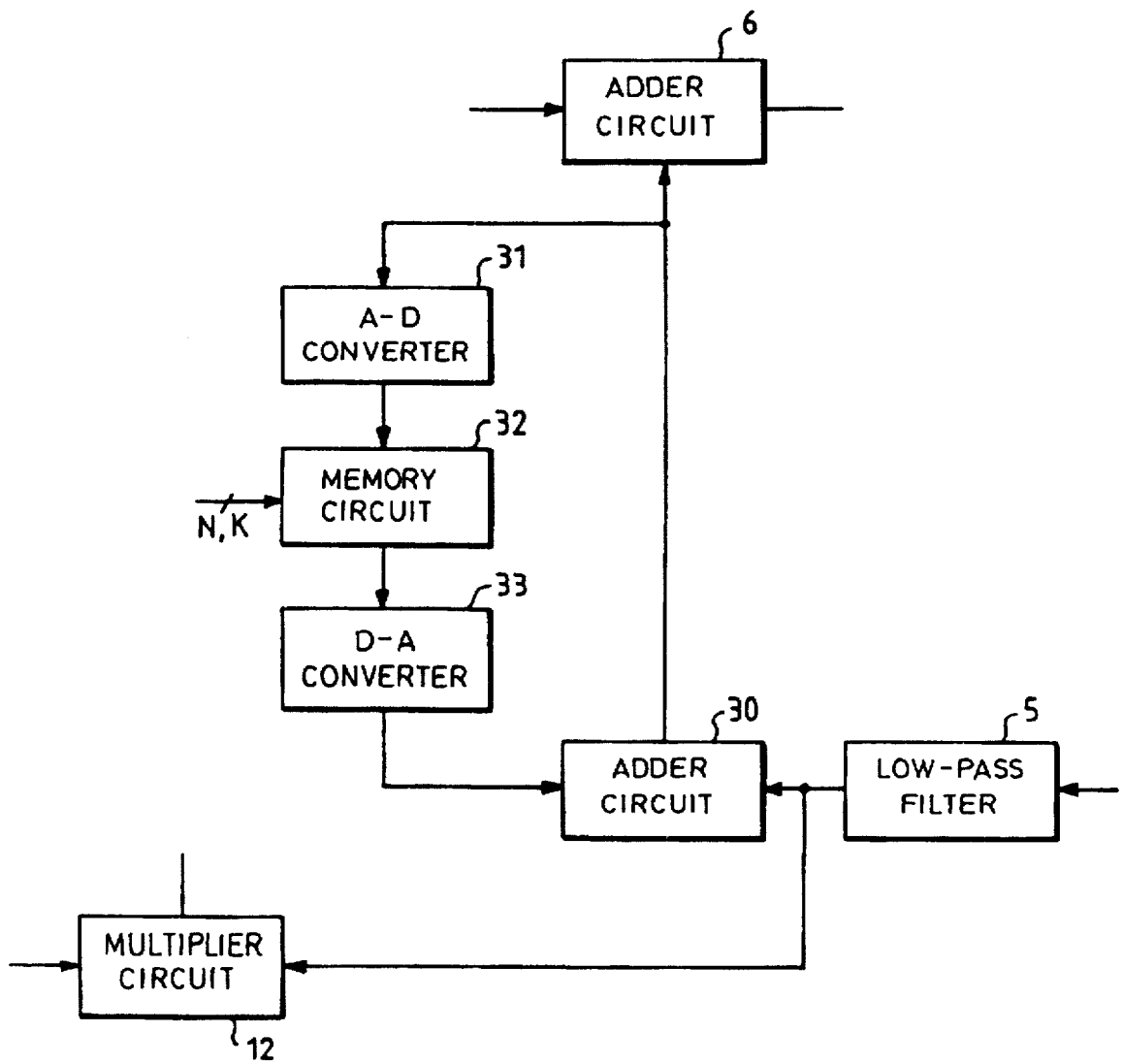

The diagram of an embodiment of these means for presetting the control voltage of the variable oscillator 1 is given by FIG. 8. In this embodiment, it is the output of the filter 5 which is linked to the first input of the multiplier circuit 12 according to FIG. 7, and this output of the filter 5 is no longer linked directly to the adder circuit 6 but is coupled thereto via presetting means consisting of an adder circuit 30, of an analogue-digital converter 31, of a memory circuit 32 and of a digital-analogue converter 33. The output of the filter 5 is linked to a first input of the adder circuit 30, the output of which is linked to the adder circuit 6; the output of the circuit 30 is linked to its second input by the converter 31, followed by the memory circuit 32, itself followed by the converter 33. After stabilisation of the slaving loop there remains, at the output of the adder circuit 30, only a DC voltage, the value of which, placed in memory in the circuit 32, is available for performing presetting of the variable oscillator 1 as soon as the parameters N and K, as a result of frequency jumps, pass back through the values corresponding to this memory storage; the parameters N, K supply the address in the memory circuit 32; the instant of change of N, K, delayed by the loop stabilisation time, gives the instant of memory-storage at the address N, K; the instant of change of N, K gives the instant of reading at the address N, K.

Figure 9:
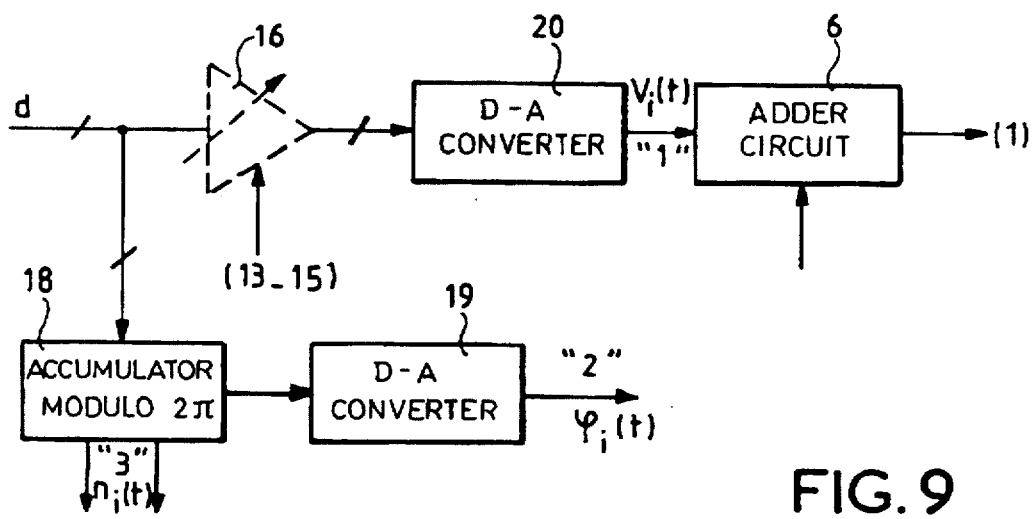

FIG. 9 shows how the signals $V_i(t)$, $\phi_i(t)$ and $n_i(t)$ can be obtained in the case of an analogue frequency modulation.

In FIG. 9 a variable amplifier 16 has been represented in broken lines, which would replace the amplifiers 16a, 16b for possible implementation, in the layout of FIG. 9, of the residue correction layout according to FIG. 7.

The data, d, corresponding to the information to be transmitted are applied to the input of a digital-analogue converter 20 in order to obtain a type 1 analogue modulation signal $V_i(t)$; this signal is applied to the adder circuit 6 according to FIG. 4. The data d are also applied to the input of a phase accumulator modulo $2\pi$, 18, the 0 and $2\pi$ crossings of which supply the type 2 modulation signal $n_i(t)$, and the count of which, converted into analogue by a digital-analogue converter 19, supplies the type 3 modulation signal $\phi_i(t)$.

The present invention is not limited to the examples described above; it applies, in particular, to all continuous phase modulations by frequency synthesizer with phase-locked loop whatever the modulation signal and the synthesizer.

We claim:

1. A modulation device for continuous phase modulation by a frequency synthesizer, including an adder circuit with a modulation input, a control input and an output, a variable oscillator with a control input coupled to the output of the adder circuit to receive a control voltage, and an output, a slaving loop with an input coupled to the output of the oscillator and an output coupled to the control input of the adder circuit, the slaving loop including a reference oscillator and, successively between the output and the input of the loop, a frequency division circuit, a phase comparator and a loop filter of low-pass type, having an output in which the comparator compares the output signals of the division circuit and of the reference oscillator, and the loop including at least one of a first modulation access and a second modulation access, wherein said first modulation access consists of an input coupled to the input of the loop filter and said second modulation access consists of a control input for the control of the division circuit, said device further including means for continuous correction of the modulation residues in the loop, these means including a compensation filter with an input coupled to the modulation input, this compensation filter producing the same filtering effect as the loop, and a correlation circuit with two inputs coupled respectively to the compensation filter and to the loop filter and an output coupled to the control input of the variable oscillator, in order to supply a correction signal.

2. A modulation device according to claim 1, wherein the correlation circuit includes a multiplication circuit followed by a filter.

3. A modulation device according to claim 1, wherein the correction means include a variable amplifier arranged upstream of the control input of the variable oscillator and wherein the output of the correlation circuit is coupled to the control input of the variable amplifier, and the output of the variable amplifier is coupled to the control input of the variable oscillator.

4. A modulation device according to claim 1, which includes means for memory storage of the correction signal, in order to store the correction signal in memory when the device is working with a central frequency of a given value and in order to restore the memory-stored signal when the central frequency, after having been altered, comes back to the given value.

5. A modulation device according to claim 1, which includes presetting means for presetting the control voltage of the variable oscillator when the device is working with the central frequency of a given value, these means being arranged between the output of the loop filter and the control input of the variable oscillator and including an auxiliary adder circuit with a first input coupled to the output of the loop filter, a second input, an output coupled to the input of the variable oscillator, and, in series between the output of said auxiliary adder circuit and said second input of said auxiliary adder circuit, an analog-digital converter, a memory circuit controlled as a function of the central frequency to be obtained by the device, and a digital-analog converter.

* * * * *